(12) United States Patent
Le et al.

(10) Patent No.: US 8,011,084 B2
(45) Date of Patent: Sep. 6, 2011

(54) METHOD FOR FABRICATING NARROW MAGNETIC READ WIDTH TMR/CPP SENSORS

(75) Inventors: Quang Le, San Jose, CA (US); Jui-Lung Li, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 472 days.

(21) Appl. No.: 12/184,054

(22) Filed: Jul. 31, 2008

(65) Prior Publication Data
US 2010/0024201 A1 Feb. 4, 2010

(51) Int. Cl.
*G11B 5/127* (2006.01)
*H04R 31/00* (2006.01)

(52) U.S. Cl. .......... 29/603.16; 29/603.13; 29/603.14; 29/603.15; 29/603.18; 216/62; 216/65; 216/66; 360/324.1; 360/324.11; 360/324.12; 360/324.2; 451/5; 451/41

(58) Field of Classification Search .......... 29/603.07, 29/603.13–603.16, 603.18; 216/62, 65, 66; 360/324.1, 324.2, 324.11, 324.12; 427/127–131
See application file for complete search history.

(56) References Cited

U.S. PATENT DOCUMENTS

| | | | |
|---|---|---|---|
| 5,930,084 A | 7/1999 | Dovek et al. ............... 360/113 |
| 6,669,983 B2 | 12/2003 | Kagami et al. ............. 427/130 |
| 6,858,909 B2 | 2/2005 | Cyrille et al. ............... 257/414 |
| 6,969,625 B2 | 11/2005 | Cyrille et al. ................. 438/24 |
| 6,995,960 B2 | 2/2006 | Seyama et al. .......... 360/324.11 |
| 7,008,550 B2 * | 3/2006 | Li et al. ....................... 216/22 |
| 7,186,348 B2 | 3/2007 | Chen et al. .................... 216/22 |
| 7,243,412 B2 | 7/2007 | Furukawa et al. ........ 29/603.14 |
| 7,500,303 B2 * | 3/2009 | Chen et al. ................ 29/603.16 |
| 2003/0235989 A1 | 12/2003 | Jayashankar ............... 438/691 |
| 2005/0067374 A1 | 3/2005 | Baer et al. ..................... 216/22 |
| 2006/0007603 A1 | 1/2006 | Meguro et al. .............. 360/320 |
| 2006/0094129 A1 | 5/2006 | Pinarbasi ........................ 438/3 |
| 2006/0132983 A1 | 6/2006 | Osugi et al. ................. 360/313 |
| 2006/0256482 A1 | 11/2006 | Araki et al. ................. 360/319 |
| 2006/0278604 A1 | 12/2006 | Yoshida et al. ............... 216/22 |
| 2006/0279882 A1 | 12/2006 | Honda et al. ............ 360/324.12 |
| 2006/0292705 A1 | 12/2006 | Hegde et al. .................... 438/3 |
| 2007/0030592 A1 | 2/2007 | Shintani et al. ............. 360/126 |
| 2007/0266550 A1 * | 11/2007 | Chen et al. ................ 29/603.16 |
| 2008/0274623 A1 * | 11/2008 | Guthrie et al. .............. 438/712 |

* cited by examiner

*Primary Examiner* — Paul D Kim
(74) *Attorney, Agent, or Firm* — Zilka-Kotab, PC

(57) ABSTRACT

A method for manufacturing a manufacturing a magnetoresistive sensor that allows the sensor to be constructed with a very narrow and well controlled track width. The method includes depositing a layer of diamond like carbon over a series of sensor layers. A first mask is then formed to define a sensor, and an ion milling is performed to remove sensor material not protected by the first mask. Then, a second mask is formed, and a hard bias layer is deposited to the thickness of the sensor layers. The second mask is then lifted off and a CMP is performed to remove the first mask structure. Because all areas other than the area directly over the sensor are substantially planar a quick, gentle CMP can be used to remove the first mask layer even if the first mask is small, such as for definition of a very narrow track-width sensor.

23 Claims, 23 Drawing Sheets

METHOD FOR FABRICATING NARROW MAGNETIC READ WIDTH TMR/CPP SENSORS

FIELD OF THE INVENTION

The present invention relates to magnetoresistive sensors and more particularly to a method for manufacturing a sensor having a very narrow track width.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

A magnetoresistive sensor referred to as a giant magnetoresistive (GMR) sensor has been employed for sensing magnetic fields from the rotating magnetic disk. The sensor includes a nonmagnetic conductive layer, referred to as a spacer layer, sandwiched between first and second ferromagnetic layers, referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

In the push to increase data density and sensor performance, researchers have sought to develop tunnel junction sensors (TMR sensor). These sensors operate based on the spin dependent tunneling of electrons through a thin, electrically insulating barrier layer. Such sensors have the potential to provide improved data density. However, even with the use of such TMR sensors, there is still an ever increasing need for improved data density.

SUMMARY OF THE INVENTION

The present invention provides a method for manufacturing a magnetoresistive sensor having a very narrow trackwidth for increased data density. The method includes depositing a layer of diamond like carbon (DLC) over a series of sensor layers. A first mask is then formed to define a sensor, and an ion milling is performed to remove sensor material not protected by the first mask. ALD (atomic layer deposition) alumina is deposited then a second mask is formed, and a hard bias layer is deposited to the thickness of the sensor layers. The second mask is then lifted off and a second layer of DLC is deposited. A CMP is performed to remove the first mask structure.

The removal of the second mask layer advantageously removes the deposited hard bias material in areas removed from the sensor and the field area. Therefore, the structure prior to CMP is substantially planar in all areas other than directly over the sensor.

Because the all areas other than the area directly over the sensor are substantially planar (due to the removal of the second mask and the low level of the hard bias material) a gentle CMP can be used to remove the first mask layer. This is true even if the first mask is small as would be the case when defining a very narrow track-width sensor.

The lift off of the second mask structure focuses the CMP on the first mask (the mask used to define the sensor) thereby facilitating removal of the first mask.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
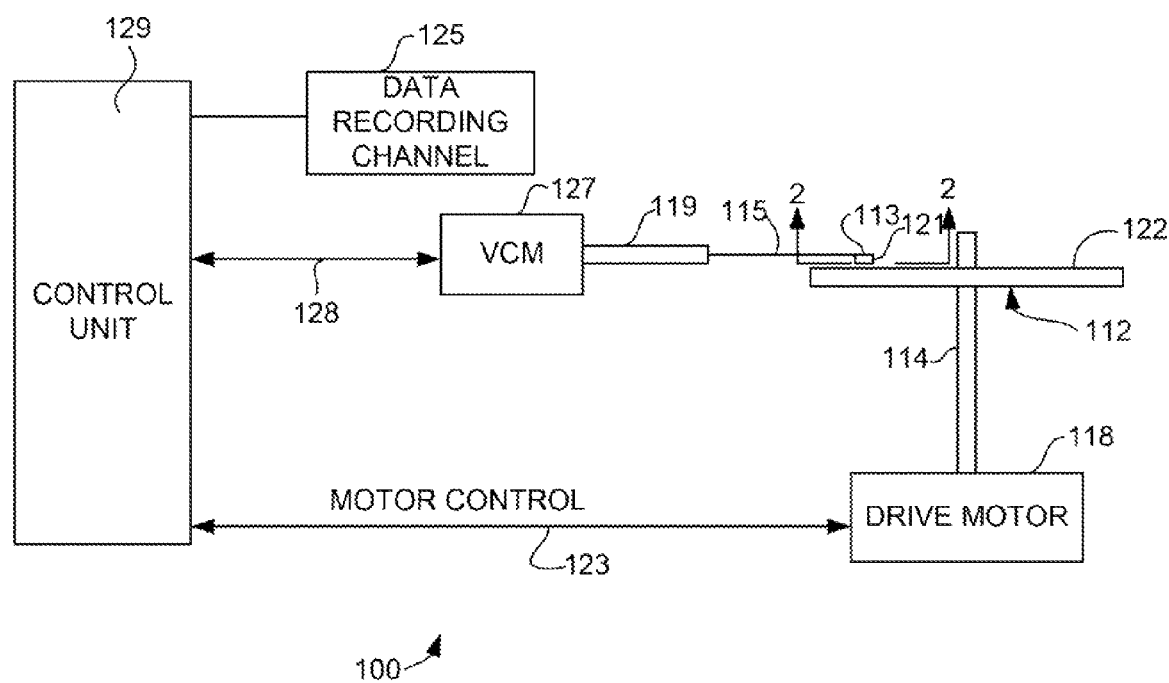
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
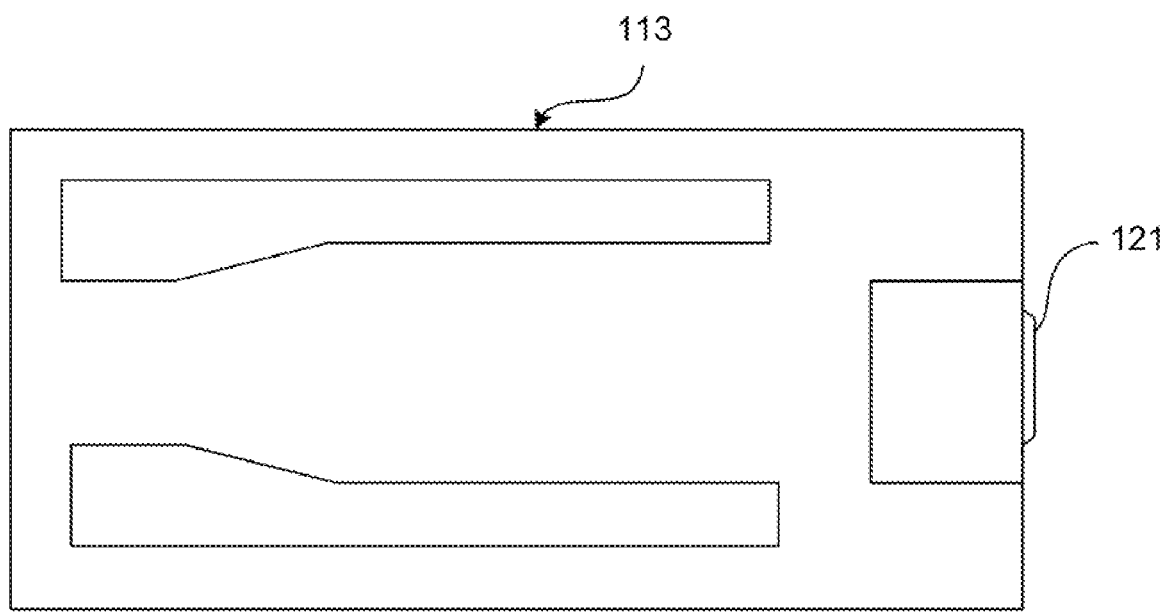
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
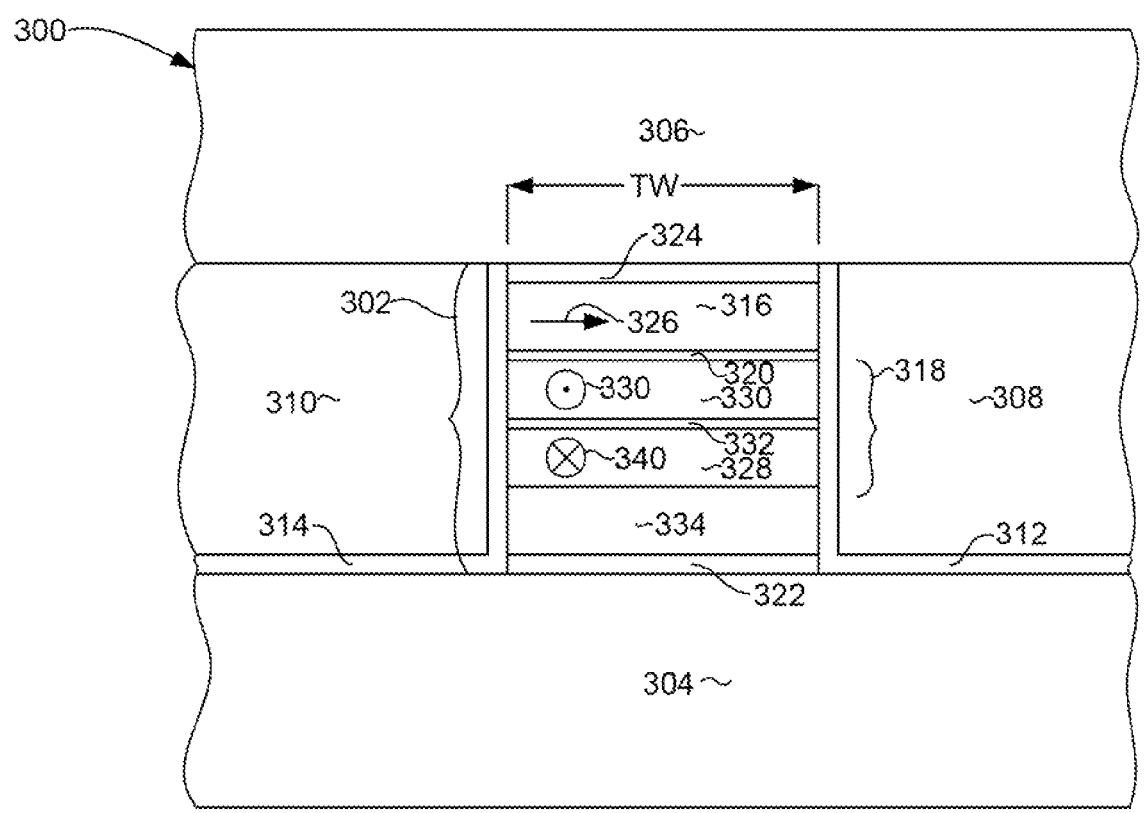
FIG. 3 is an enlarged ABS view of a magnetoresistive sensor of a magnetic head for use in disk drive system.

With reference now to FIG. 3, a magnetic head 300 includes a sensor stack 302 sandwiched between first and second electrically conductive leads 304, 306. The leads 304, 306 can be constructed of a magnetic material such as NiFe so that they can function as magnetic shields as well as leads. First and second hard bias layers 308, 310, constructed of a high coercivity material such as CoPtCr or some other suitable material can be formed at either side of the sensor stack 302. The hard bias layers 308, 310 are separated from the sensor stack 302 by insulation layers 312, 314, which can be constructed of a material such as alumina. The insulation layers 312, 314 also cover at least one of the lead layers 304 to prevent sense current from being shunted through the hard bias layers 308, 310.

The sensor stack 302 includes a pinned layer structure 318 and a free magnetic layer 316. A non-magnetic spacer or barrier layer 320 is sandwiched between the free layer 316 and the pinned layer structure 318. The invention can be embodied in a tunnel junction sensor or in a giant magnetoresistive (GMR) sensor. If embodied in a tunnel valve sensor, the layer 320 is a non-magnetic, electrically insulating barrier layer. If embodied in a GMR sensor, the layer 320 is a non-magnetic, electrically conductive spacer layer such as Cu or Co—O. The free layer can be constructed of a material such as Co, CoFe, NiFe or a combination of these materials.

The pinned layer structure 318 preferably is an antiparallel coupled structure including a first magnetic layer 328 a second magnetic layer 330 and a thin antiparallel coupling layer 332 such as Ru sandwiched between the first and second magnetic layers 328, 330. The first and second magnetic layers 328, 330 can be constructed of a material such as CoFe or some other suitable magnetic material.

A layer of antiferromagnetic material 334 such as IrMn of PtMn below the first magnetic layer 334 is exchange coupled with the first magnetic layer 328. This exchange coupling strongly pins the magnetization of the first magnetic layer 328 in a first direction perpendicular to the air bearing surface (ABS) as indicated by arrow tail symbol 338. Antiparallel coupling between the first and second magnetic layers 328, 330 pins the magnetization of the second magnetic layer 330 in a second direction that is antiparallel to the first direction as indicated by arrow head symbol 340.

A seed layer 322 can be provided at the bottom of the sensor stack 322 to initiate a desired grain structure in the above deposited layers. In addition, a capping layer 324 such as Ta can be provided at the top of the top of the sensor stack to protect the layers of the sensor stack 302 during manufacture.

The free layer 316 has a magnetization that is biased in a direction parallel to the ABS as indicated by arrow symbol 326, but which is able to rotate in response to an external magnetic field, such as from a signal from a magnetic medium. The magnetization 326 of the free layer is biased by a bias field from the hard bias layers 308, 308, 310. The electrical resistance through the sensor stack 302 changes in response to deflections in the magnetization of the free layer 316. When the magnetization 326 of the free layer 316 is parallel with the magnetization 330, resistance is at a minimum and when the magnetization 326 is antiparallel to the magnetization 330, resistance is at a maximum.

The sensor stack 302 has a width TW that defines the track width of the head 300. In order to maximize data density, it is desirable that the track width TW be as small as possible. Reduction of this trackwidth TW, has previously been prevented by manufacturing limitations. With reference now to FIGS. 4-23 a method is described for producing a read head such as the read head 300 having a greatly reduced track width TW.

Figure 4:
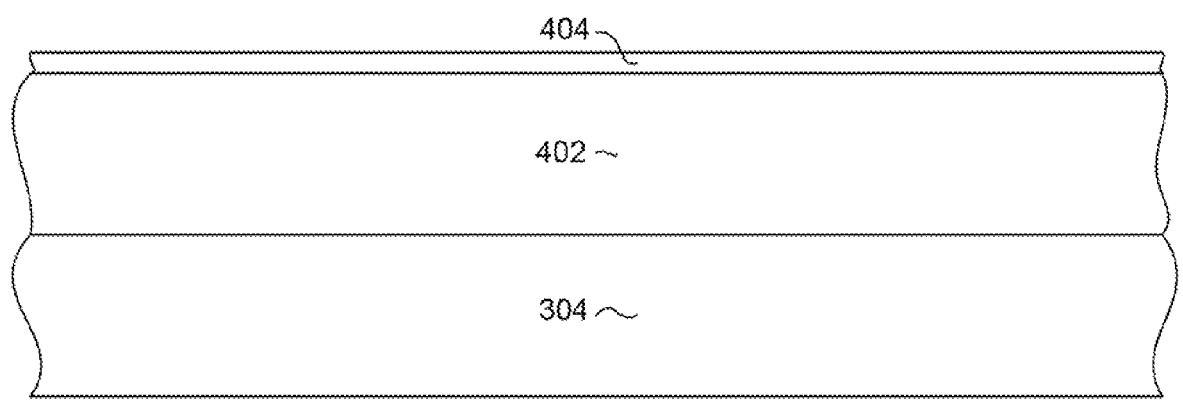
FIGS. 4-23 are views of a magnetoresistive sensor in various intermediate stages of manufacture, illustrating a method of manufacturing a sensor according to an embodiment of the invention.

With particular reference to FIG. 4, the first lead layer 304, is provided. As mentioned above, the lead layer 304 can be an electrically conductive magnetic material such as NiFe. A series of sensor layer 402 is deposited over the lead layer 304. The series of sensor layers 402 can be layers such as those of the sensor stack 302 described above with reference to FIG. 3. A hard mask layer 404, which is preferably diamond like carbon (DLC), with density between 1.8-2.9 g/cc and stress less −4 GPa, is deposited over the sensor layers 402. The higher the density of DLC, the thinner the thickness of the carbon to serve both as an effective hard mask and CMP stop layer. The high density of the DLC layer 404 allows the layer 404 to be deposited much thinner. This allows the layer 404 to be used as a hard mask and CMP stop layer, while also reducing shadowing effects during ion milling and improving deposition of subsequent layers. The net result is a flat junction at the sides of the sensor, and a flat upper shield/lead 306 (FIG. 3).

Figure 5:
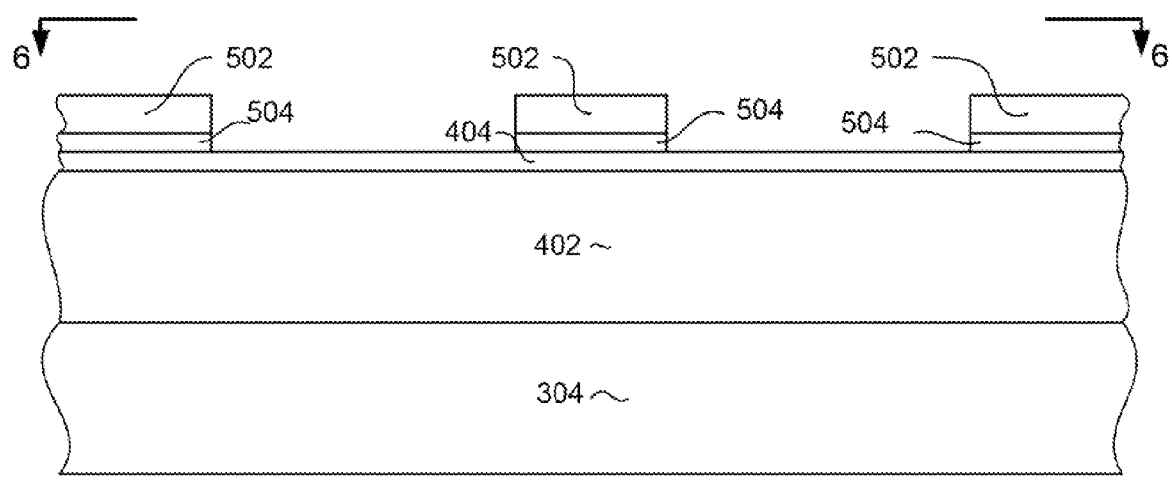
Figure 6:
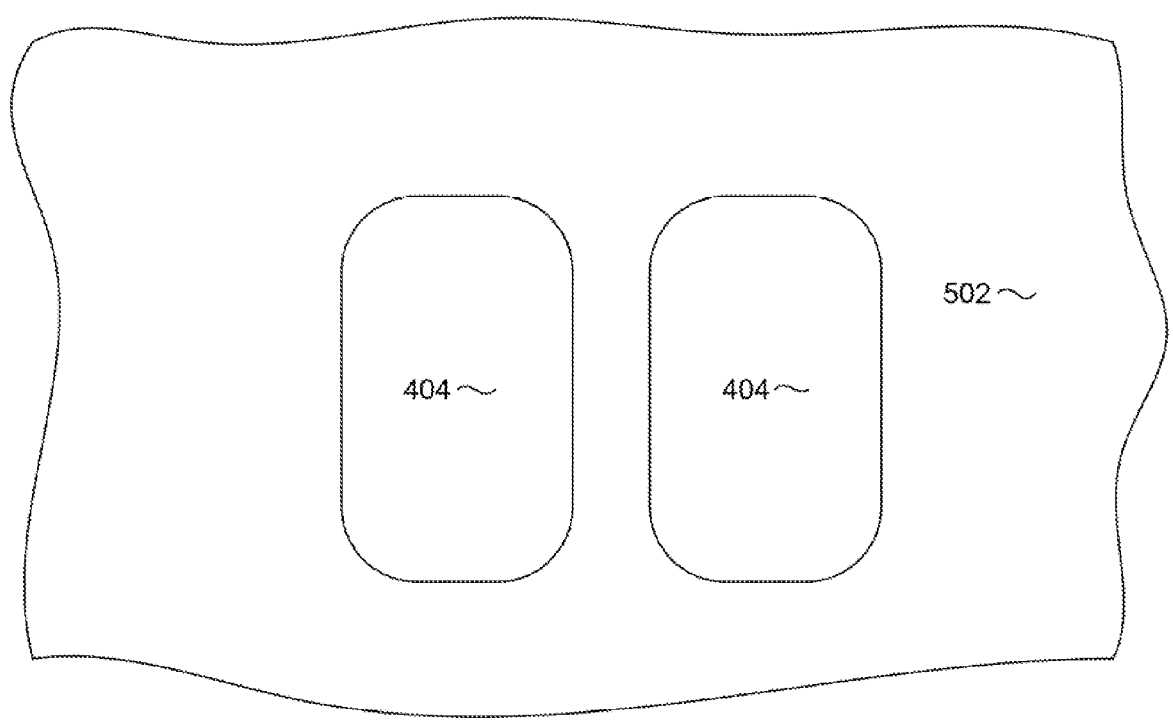

With reference now to FIG. 5, a first mask structure 502 is formed over the DLC layer 404. The mask structure includes a photolithographically patterned photoresist layer 504, and may be formed over a soluble polyimide layer 504, such as DURIMIDE® that can serve as an image transfer layer, release layer, and also as an antireflective coating. The mask structure 502 is a track width defining mask and has a shape that can be seen more clearly with reference to FIG. 6, which is a top-down view of the structure shown in FIG. 5.

Figure 7:
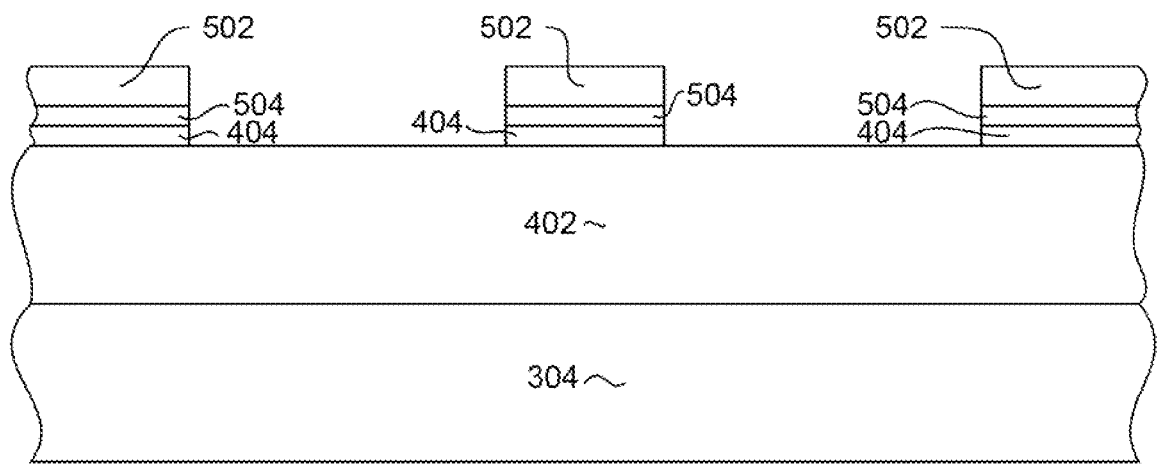
Figure 8:
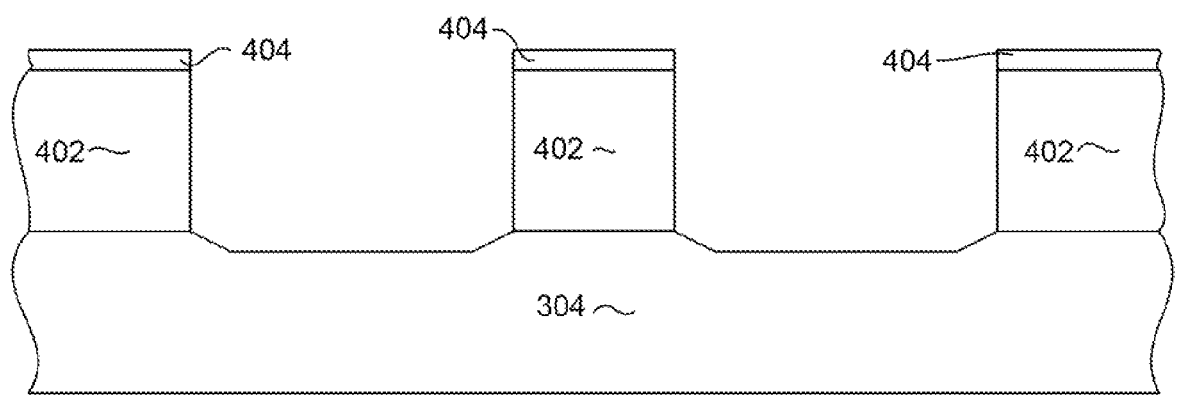

After forming the mask structure 502, a reactive ion etching (RIE) is performed to remove portions of the layer 504 and DLC 404 layers that are not covered by the mask structure 502, thereby transferring the image of the first mask structure 502 onto the underlying DLC layer 404. This results in a structure such as shown in FIG. 7. The mask structure 502 and layer 504 are then removed by exposure to TMAH (tetramethyl ammonium hydroxide) developer and hot NMP (N-METHYL PYRROLIDONE), leaving behind the DLC layer 404. Then, an ion milling is performed to remove portion of the sensor material 402 that are not protected by the DLC layer 404, resulting in a structure such as shown in FIG. 8.

Figure 11:
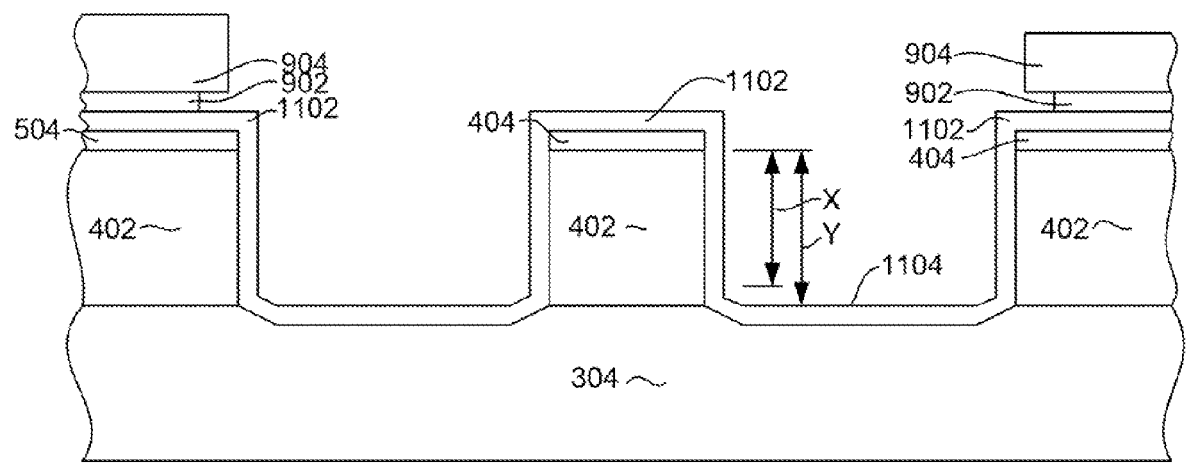

With the mask structure 502 removed, there is less "shadowing effect" during ion milling and hard bias fill, resulting in a flat junction. After the ion milling, optionally, the sensor layers 402 can be exposed to ozone to oxide the exposed portions of the sensor layer. This ozone treatment can also be used to further reduce the track-width of the sensor. Afterward, a thin layer of electrically insulating material 1102 is deposited full film, as shown in FIG. 11. The layer 1102 is preferably alumina and is preferably deposited by a conformal deposition method such as chemical vapor deposition (CVD) or atomic layer deposition (ALD), most preferably ALD.

Figure 9:
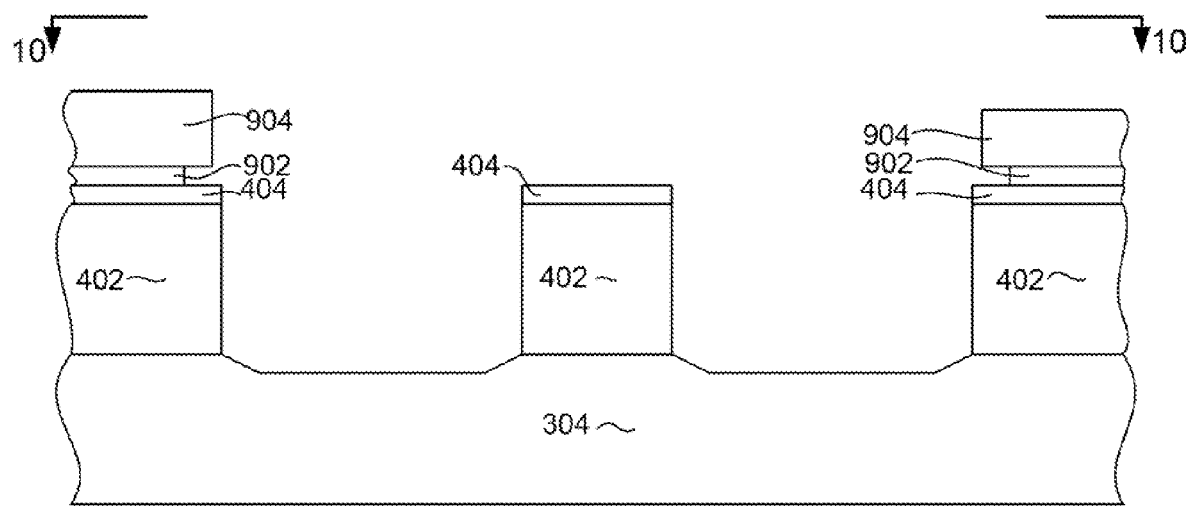
Figure 10:
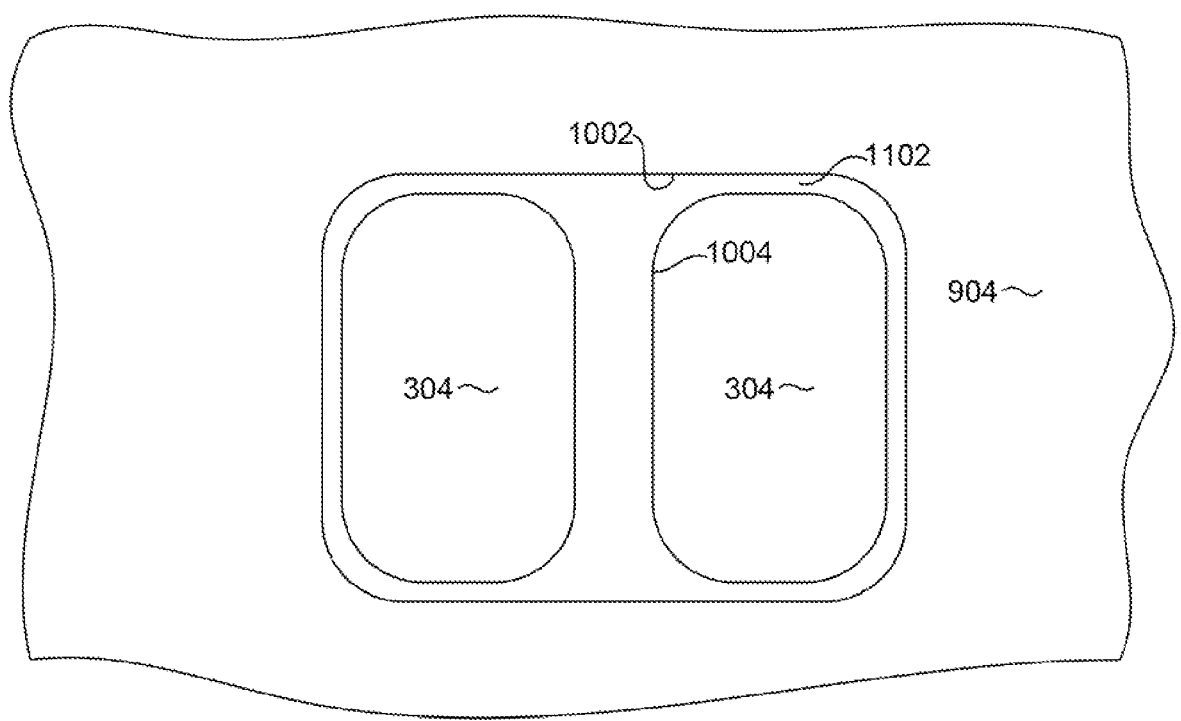

After deposition of the ALD layer 1102, a second mask structure 904 can be photolithographically patterned over the mask structure 502, as shown in FIG. 9. The mask 904 can be a photolithographically patterned photoresist, and a lift off material 902 can be provided under the mask 904 to facilitate later removal of the mask 904. The lift off material can be a material such as PMGI (polymethylglutarimide) resist. The layers 902, 904 together define a bi-layer mask structure. The shape of the mask structure 904 can be seen more clearly with reference to FIG. 10 which shows a top down view as taken from line 10-10 of FIG. 9. As can be seen more clearly with reference to FIG. 10, the mask 904 has an opening 1002 that leaves a sensor area 1004 uncovered.

As an option, metrology can be performed to determine the depth of step X of the sensor stack and depth Y from the top of the sensor stack 402 the floor 1104 of the substrate 304. This data can then be used to determine desired hard bias layer and spacer or capping layer thicknesses.

Figure 12:
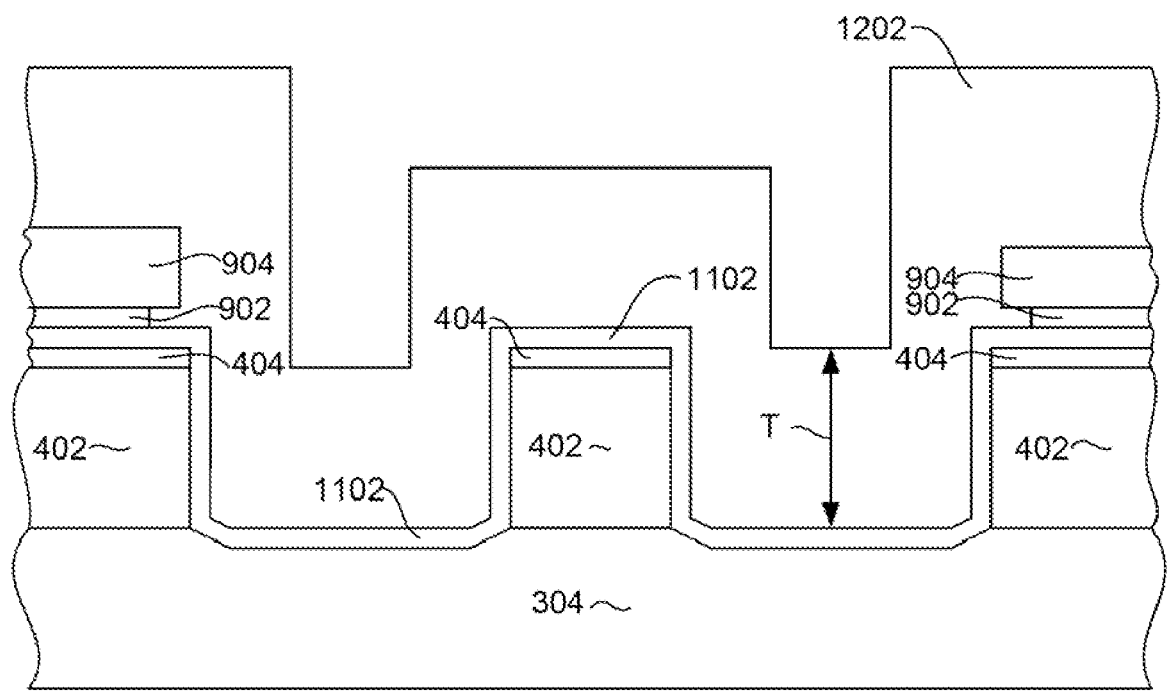
Figure 13:
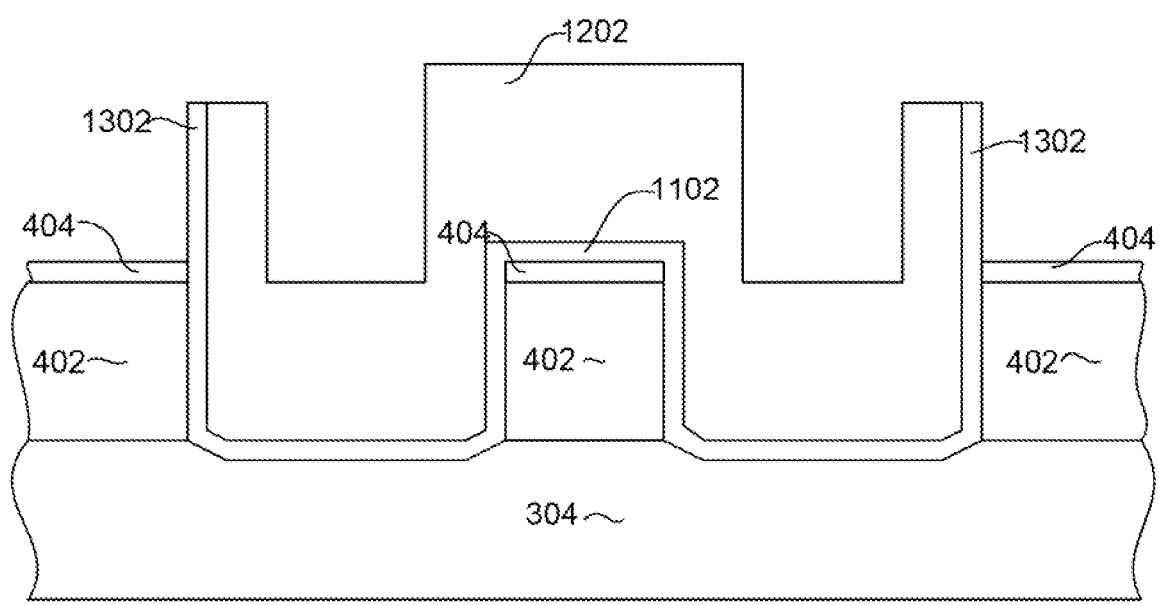
Figure 14:
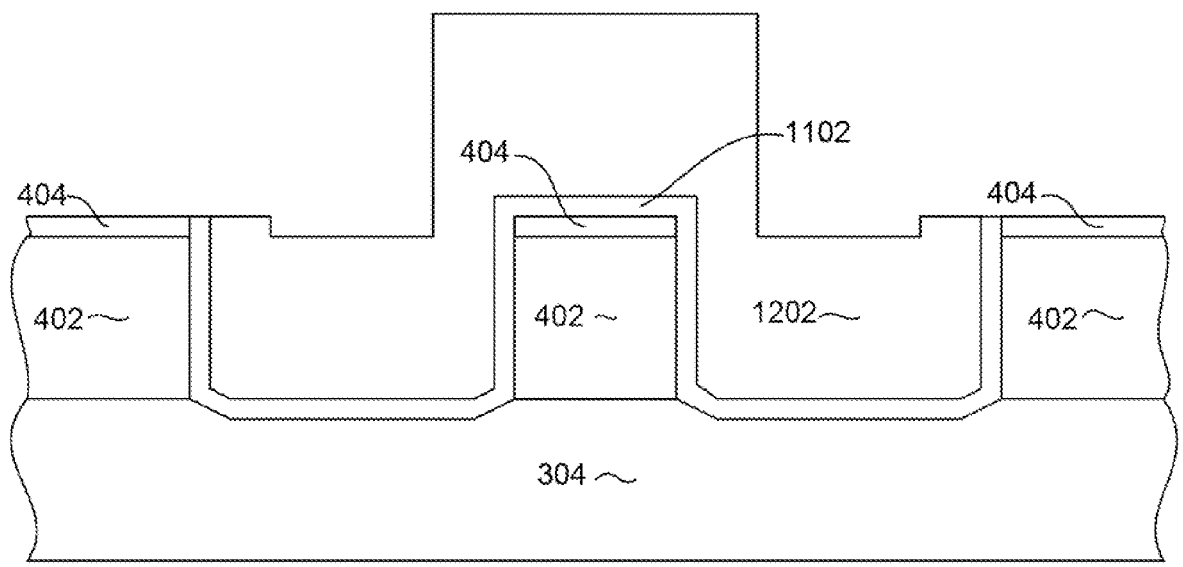

Then, with reference to FIG. 12, a layer of hard magnetic material 1202 is deposited. The hard magnetic (hard bias) material 1202 can be a material such as CoPtCr or some other suitable material having a high magnetic coercivity, and may include a spacer such as Cr and CrMo, and capping layer such as Rh/Ta. Using the metrology data discussed above, the hard bias layer 1202 is deposited to a thickness T such that the top of the hard bias layer is substantially level with the top of the sensor stack layer 402 or to the level of the DLC layer 404.

The structure is then wrinkle baked and soaked in a hot NMP (N-METHYL PYRROLIDONE ) solution. Any re-deposited material (re-dep) and hard bias materials (1202) resulting from the previous ion milling and RIE processes and hard bias deposition is then removed, resulting in a structure such as that shown in FIG. 13, with exposed DLC fences 1302. Then, a snow cleaning can be performed, resulting in a structure such as that shown in FIG. 14. The snow cleaning process can comprise exposing the surface to a high pressure $CO_2$ gas.

Figure 15:
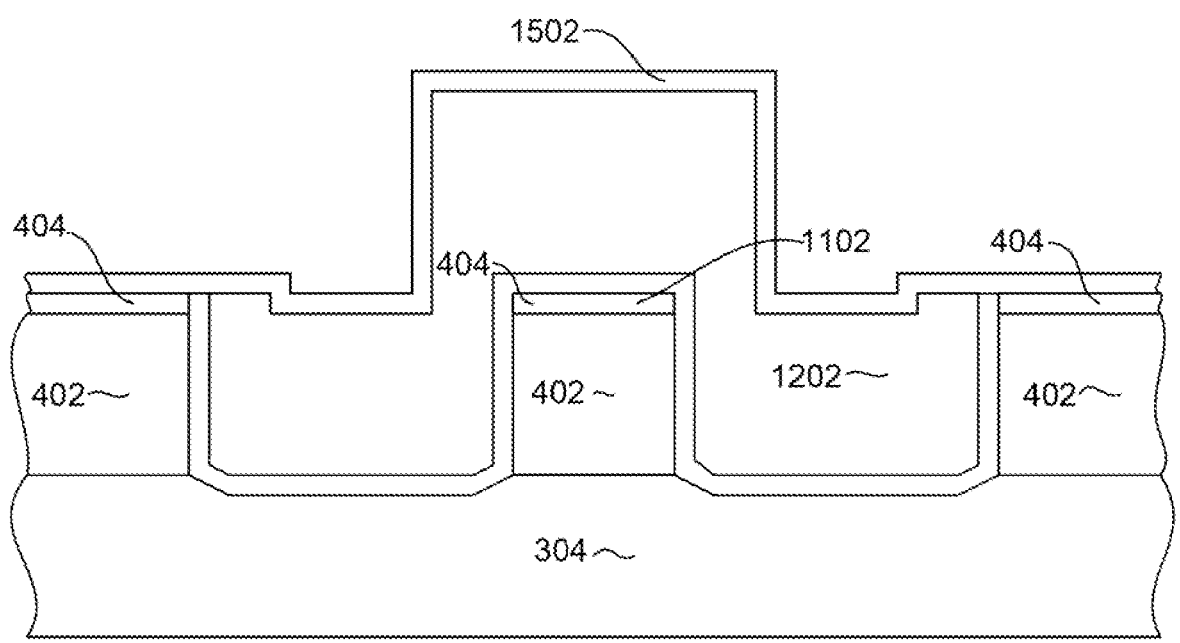
Figure 16:
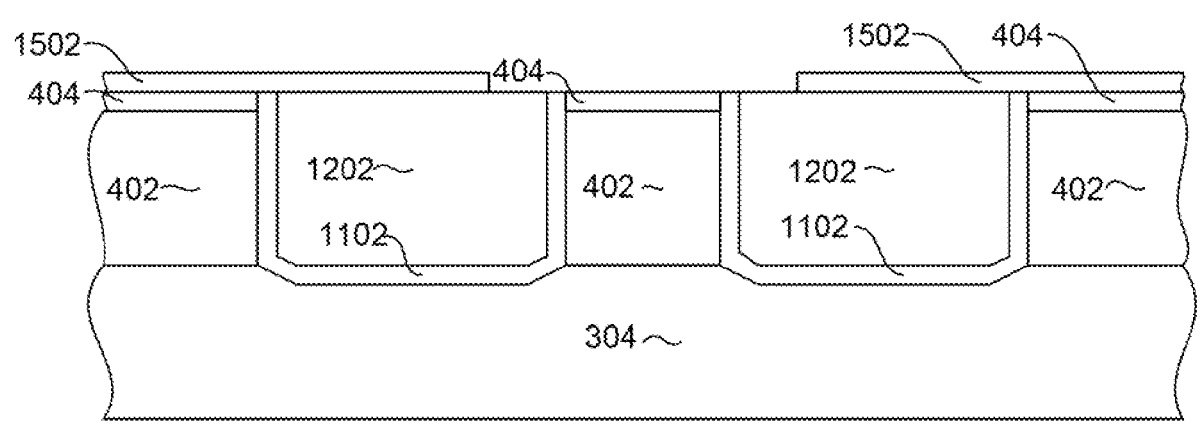

Then, with reference to FIG. 15, a second layer of diamond like carbon (DLC) 1502 is deposited full film. A chemical mechanical polishing (CMP) is then performed, resulting in a structure as shown in FIG. 16. Note with a thinner DLC as the hard mask and CMP stop layer, there is less "shadowing effect" during hard bias deposition. The net result is a flat junction.

Optionally, in another embodiment, the second layer of DLC 1502 can be deposited after deposition of hard magnetic material 1202. The structure is then wrinkle baked and soaked in a hot NMP solution. Then, a snow cleaning can be performed. As a result, ALD alumina in the field is exposed and removed during CMP, leaving DLC everywhere after CMP.

When the junction profile is vertical and when a thin hard mask is used as discussed above, there is less shadowing effect. Hard bias deposition results in minimal topography. Depositing a second layer of DLC 1502 followed by CMP produces a flat junction. Recent design requires the junction profile to be tapered. Hard bias deposition results in increase topography. In order to produce flat junction, the second layer of DLC 1502 is replaced with a nonmagnetic sacrificial layer such as CrMo or Cr. During CMP, the nonmagnetic sacrificial layer is removed along with the first mask. The CMP is terminated when DLC is exposed.

In another embodiment, an ion milling approach can be used instead of the lift-off approach to remove materials in the field. In this case, after ALD alumina deposition, the hard bias is deposited. A photo structure consisting of layers 902 and 904 (FIG. 9) is done to protect the original mask structure. Ion milling is done to remove materials that are exposed. The photo structure is removed by NMP follow by DLC is deposition. A chemical mechanical polishing is then performed, resulting in a structure as shown in FIG. 16.

Figure 17:
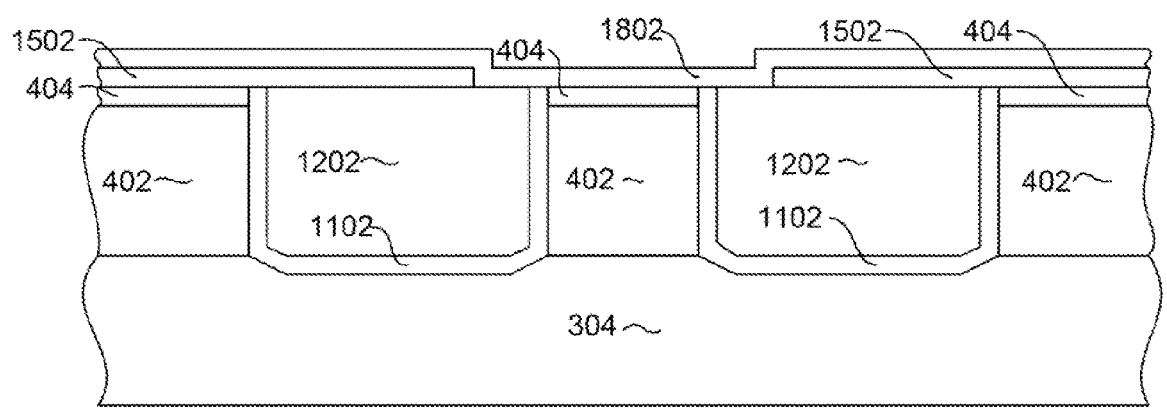

Then, with reference to FIG. 17, another (third) layer of DLC 1802 is deposited. The DLC layer 1802 can either be deposited directly over the underlying DLC layers 404, 1502 or the underlying DLC layers 404, 1502 can be removed prior to depositing the third DLC layer 1802.

Figure 18:
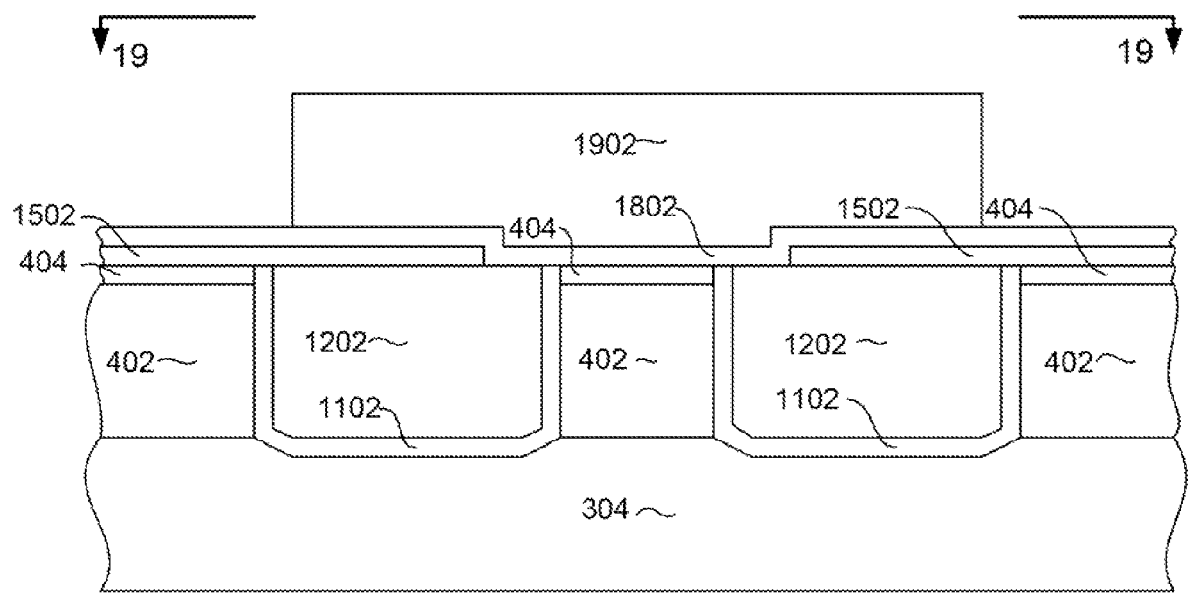
Figure 19:
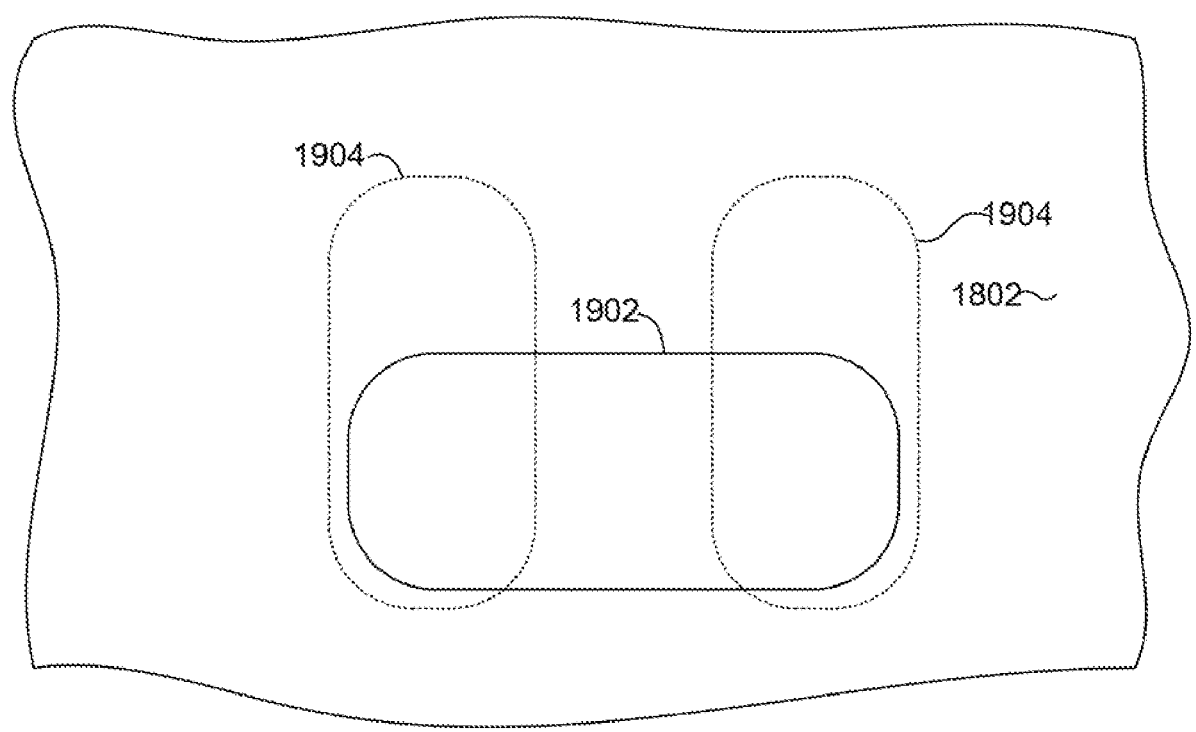

Then, with reference to FIG. 18, a third mask structure 1902 is formed. The third, mask structure 1902 is a stripe height defining mask structure, in that it defines the location of the back edge of the sensor. This can be seen more clearly with reference to FIG. 19, which shows a top down view as taken from line 19-19 of FIG. 18. As can be seen in FIG. 19, the mask structure 1902 covers an area that is smaller than the area of openings in the first mask 502 described above with reference to FIGS. 5 and 6. The openings of the first mask 502 are indicated by dotted lines 1904 in FIG. 19.

Figure 20:
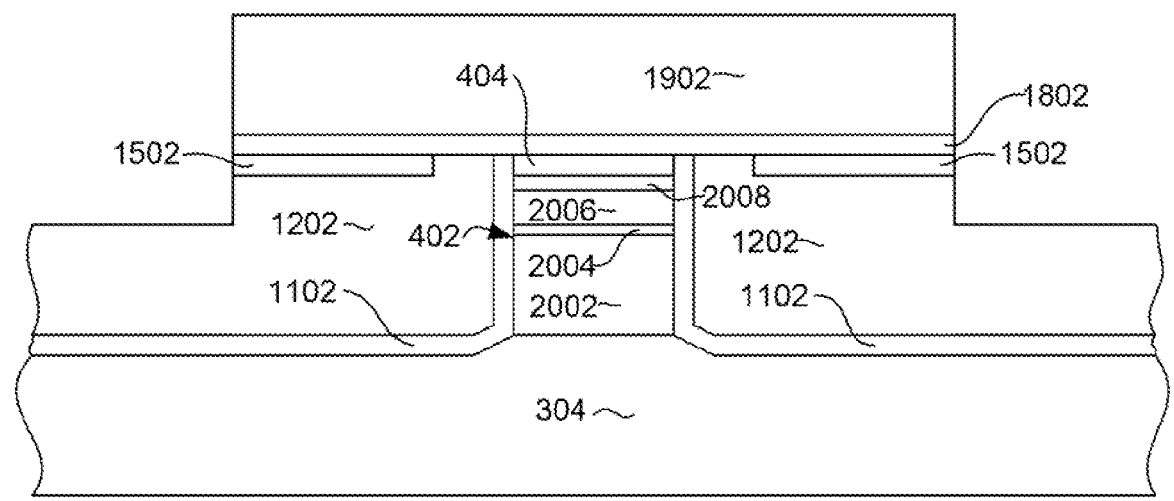

A reactive ion etching (RIE) is then performed to transfer the image of the mask 1902 into the DLC layers 1802, 1502, 404. Then, a partial ion milling is performed to remove remaining material not protected by the mask 1902, resulting in a structure such as that shown in FIG. 20. In order for the sensor to be stabilized, the hard bias 1202 (FIG. 18) cannot be completely removed. Therefore, the ion milling step does not completely remove sensor and hard bias. In FIG. 20 layers of the sensor 402 are shown, which can include a pinned layer structure 2002, spacer layer 2004, free layer 2006 and capping layer 2008. Ion milling is used to remove part of the sensor which includes the capping layer 2008, free layer 2006, and the spacer 2004, but leaving the pinned layer structure 2002. As a result, hard bias is also not completely removed, and extends beyond the stripe height of the sensor (not shown in FIG. 20). The remaining hard bias is sufficient to stabilize the sensor.

Figure 21:
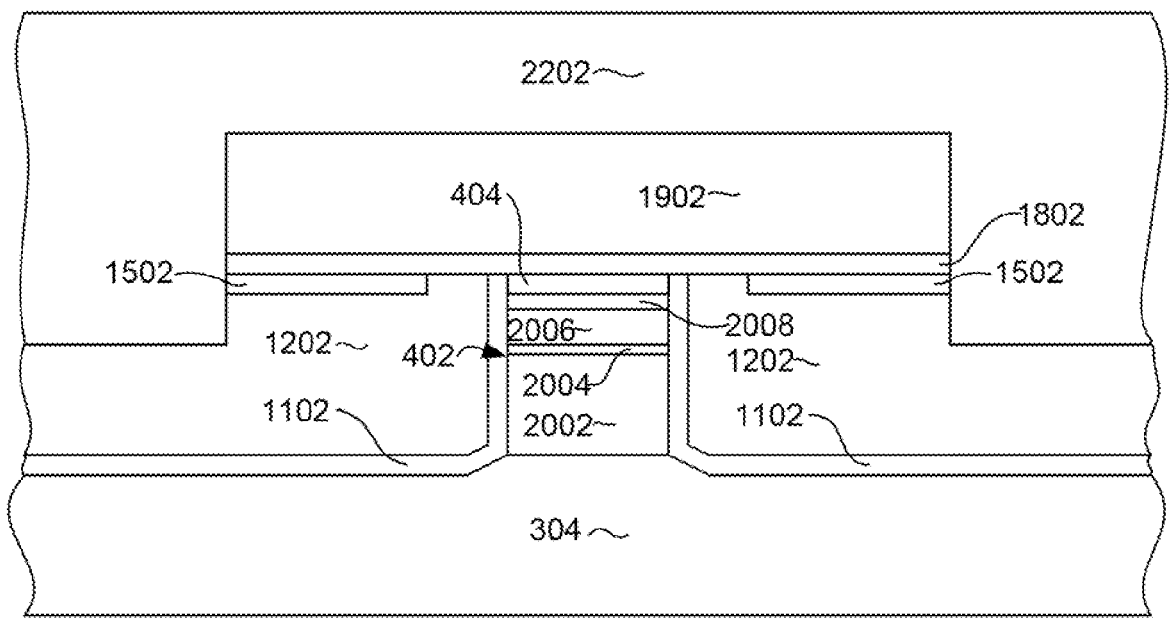
Figure 22:
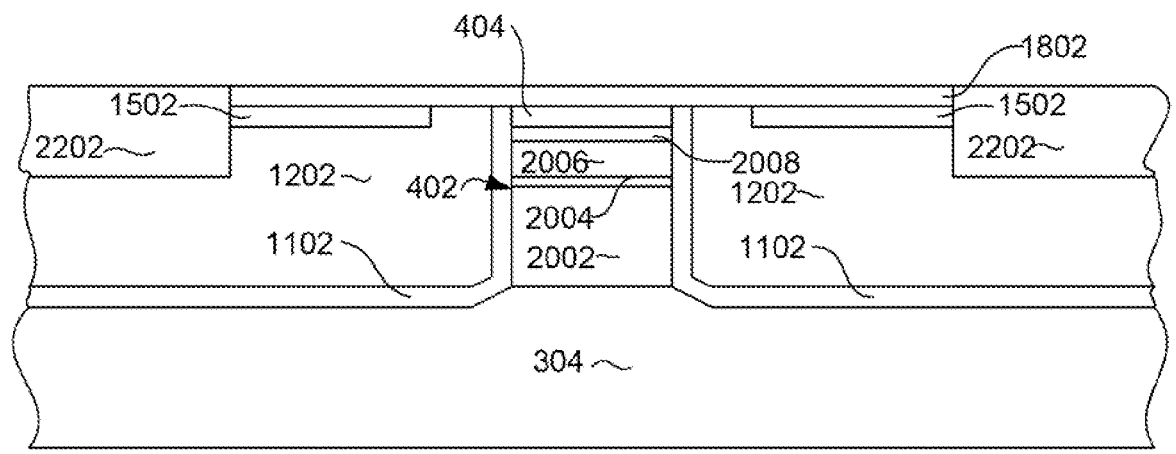

Then, with reference to FIG. 21, a thick layer of alumina fill material 2202 is deposited. This alumina layer 2202 is preferably deposited to a thickness that is higher than the top of the mask 1902. Then, a chemical mechanical polishing (CMP) can be performed, stopping at the DLC layer 1902, resulting in a structure such as that shown in FIG. 22.

Figure 23:
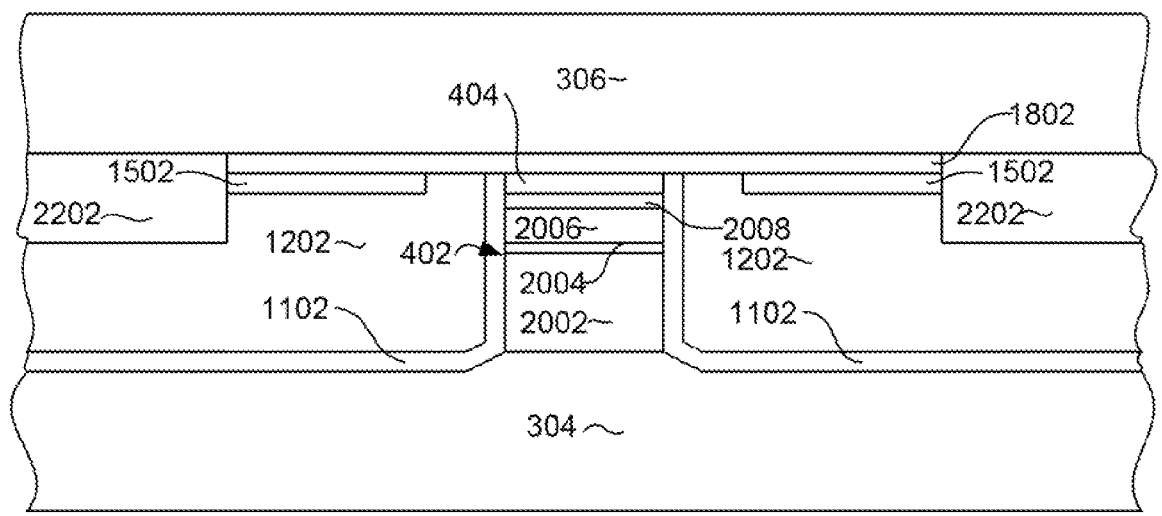

Then, with reference to FIG. 23, the remaining DLC layers 1502, 1802 can be removed by reactive ion etching (RIE) and the top lead 306 can be formed by electroplating. As discussed above with reference to FIG. 3, the top lead layer 306 can be constructed of NiFe or some similar electrically conductive, magnetic material.

The above described process advantageously allows the sensor 302 (FIG. 3) and 402 (FIG. 23) to be formed with a greatly reduced track width. Prior art CMP liftoff processes required that the mask used to define the track width be very tall in order to facilitate liftoff. However, as track widths become narrow, too much of the mask is removed during processing, making the mask very difficult to remove. Also, such prior art processes resulted in extreme topography. This topography transferred to the upper shield causing sensor instability. Also, prior art processes required that the stripe height be defined before the track width. The above described topography made accurate definition of the track-width very difficult. This also resulted in reflectivity issues that made accurate definition of the track width difficult, due to that fact that a portion of the track width defining mask was formed on sensor material and a portion on non-sensor material behind the previously defined stripe height.

The present invention solves these problems in several ways. First, because the track width is defined before the stripe height, photolithographic definition can be performed much more accurately. Furthermore, using metrology to determine the step height between the sensor surface and ion-milled surface, the spacer thickness needed can be determined based on the required hard bias thickness. The flat surface after processing will result in a flat subsequent top shield. Also, the only area exposed to CMP during definition of the track width, is the narrow sensor track-width, which makes removal of the mask by CMP much easier. This means that the CMP used to remove the track-width defining mask can be very short and robust.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetoresistive sensor, comprising:
   providing a lead layer;
   depositing a series of sensor layers over the lead layer;
   depositing a layer of diamond like carbon (DLC);
   forming a first mask structure over the first layer of DLC, the first mask structure being a trackwidth defining mask structure having first and second openings at either side of a sensor defining track width portion;
   performing a reactive ion etching to remove portions of the first DLC layer that are not protected by the first mask layer;
   performing an ion milling to remove a portion of the series of sensor layers that is not protected by the first mask structure;
   forming a second mask structure having an opening that leaves uncovered the first and second openings of the first mask structure and the sensor defining track width portion;
   depositing a magnetic bias material to a depth such that the top of the hard bias material is located substantially at the level of the top of the series of sensor layers;
   removing the second mask layer; and
   performing a chemical mechanical polishing.

2. The method as in claim 1, further comprising, providing a lift off layer under the second mask layer to facilitate removing the second mask.

3. The method as in claim 1 further comprising, after forming the second mask structure and before depositing the magnetic bias material, depositing an electrically insulating layer.

4. The method as in claim 1 further comprising, after forming the second mask structure and before depositing the magnetic bias material, depositing a layer of alumina by atomic layer deposition.

5. The method A-method as in claim 1 further comprising, after forming the second mask structure and before depositing the magnetic bias material, depositing a layer of alumina by chemical vapor deposition.

6. The method as in claim 1 wherein the chemical mechanical polishing is performed until the first layer DLC layer has been reached.

7. The method as in claim 1 further comprising, after removing the second mask structure and before performing the chemical mechanical polishing, performing a wrinkle bake and soaking in hot NMP.

8. The method as in claim 1 further comprising, after performing the first ion milling, exposing the series of sensor layers and the first mask structure to ozone.

9. The method as in claim 1 further comprising, after removing the second mask structure and before performing the chemical mechanical polishing:
   performing a wrinkle bake;
   soaking in hot NMP; and
   performing a snow cleaning.

10. The method as in claim 1 further comprising, after removing the second mask structure and before performing the chemical mechanical polish:
    performing a wrinkle bake;
    soaking in hot NMP;
    performing a snow cleaning; and
    depositing a second layer of DLC.

11. The method as in claim 1 further comprising after performing the chemical mechanical polishing, forming a third mask structure, the third mask being a stripe height defining mask having an edge that defines a back edge of a sensor structure.

12. The method as in claim 1 further comprising after performing the chemical mechanical polishing, forming a third mask structure, the third mask being a stripe height defining mask having an edge that defines a back edge of a sensor structure; and
    performing an ion milling to remove portions of sensor layers that are not protected by the third mask structure.

13. The method as in claim 1 further comprising after performing the chemical mechanical polishing, forming a third mask structure, the third mask being a stripe height defining mask having an edge that defines a back edge of a sensor structure;

performing an ion milling to remove portions of sensor material that are not protected by the third mask structure; and depositing an alumina fill layer.

14. The method as in claim 1 further comprising after performing the chemical mechanical polishing, forming a third mask structure, the third mask being a stripe height defining mask having an edge that defines a back edge of a sensor structure;

performing an ion milling to remove portions of sensor layers that are not protected by the third mask structure;

depositing an alumina fill layer; and forming a second lead layer over the series of sensor layers.

15. A method for manufacturing a magnetoresistive sensor, comprising:

providing a lead layer;

depositing a series of sensor layers over the lead layer;

depositing a layer of diamond like carbon (DLC);

forming a first mask structure over the first layer of DLC, the first mask structure being a trackwidth defining mask structure having first and second openings at either side of a sensor defining track width portion;

performing a reactive ion etching to remove portions of the first DLC layer that are not protected by the first mask layer;

performing an ion milling to remove a portion of the series of sensor layers that is not protected by the first mask structure;

forming a second mask structure having an opening that leaves uncovered the first and second openings of the first mask structure and the sensor defining track width portion;

depositing a magnetic bias material to a depth such that the top of the hard bias material is located at a level of the DLC layer;

removing the second mask layer; and performing a chemical mechanical polishing.

16. The method as in claim 15, further comprising, providing a lift off layer under the second mask layer to facilitate removing the second mask.

17. The method in claim 15 further comprising, after forming the second mask structure and before depositing the magnetic bias material, depositing an electrically insulating layer.

18. The method as in claim 15 further comprising, after forming the second mask structure and before depositing the magnetic bias material, depositing a layer of alumina by atomic layer deposition.

19. The method as in claim 15 further comprising, after forming the second mask structure and before depositing the magnetic bias material, depositing a layer of alumina by chemical vapor deposition.

20. The method as in claim 15 wherein the chemical mechanical polishing is performed until the first layer DLC layer has been reached.

21. The method as in claim 15 further comprising, after removing the second mask structure and before performing the chemical mechanical polishing, performing a wrinkle bake and soaking in hot NMP.

22. The method as in claim 15 further comprising, after removing the second mask structure and before performing the chemical mechanical polishing:

performing a wrinkle bake;

soaking in hot NMP; and performing a snow cleaning.

23. The method as in claim 15 further comprising, after removing the second mask structure and before performing the chemical mechanical polish:

performing a wrinkle bake;

soaking in hot NMP;

performing a snow cleaning; and depositing a second layer of DLC.

* * * * *

UNITED STATES PATENT AND TRADEMARK OFFICE
CERTIFICATE OF CORRECTION

PATENT NO. : 8,011,084 B2
APPLICATION NO. : 12/184054
DATED : September 6, 2011
INVENTOR(S) : Quang Le et al.

It is certified that error appears in the above-identified patent and that said Letters Patent is hereby corrected as shown below:

On the Title Page;

Item (57) Abstract, line 12, please insert --(due to the removal of the second mask and the low level of the hard bias material)-- after "substantially planar"

In the claims:

Column 8, Line 23, please remove --A method-- after "The Method"

Signed and Sealed this
Twenty-eighth Day of May, 2013

Teresa Stanek Rea
*Acting Director of the United States Patent and Trademark Office*